United States Patent
Götz et al.

(10) Patent No.: US 9,970,787 B2
(45) Date of Patent: May 15, 2018

(54) SINE WAVE OSCILLATOR AND INDUCTIVE SENSORS

(71) Applicant: ZF Friedrichshafen AG, Friedrichshafen (DE)

(72) Inventors: Hans-Ludwig Götz, Hahnbach (DE); Thomas Luber, Hahnbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 126 days.

(21) Appl. No.: 15/021,430

(22) PCT Filed: Aug. 4, 2014

(86) PCT No.: PCT/EP2014/066685
§ 371 (c)(1),
(2) Date: Mar. 11, 2016

(87) PCT Pub. No.: WO2015/036171
PCT Pub. Date: Mar. 19, 2015

(65) Prior Publication Data
US 2016/0223359 A1 Aug. 4, 2016

(30) Foreign Application Priority Data
Sep. 12, 2013 (DE) .................. 10 2013 218 294

(51) Int. Cl.
*G01B 7/30* (2006.01)
*G01B 7/14* (2006.01)
(Continued)

(52) U.S. Cl.
CPC .......... *G01D 5/2006* (2013.01); *G01D 5/202* (2013.01); *G01D 5/2013* (2013.01); *H03K 4/92* (2013.01)

(58) Field of Classification Search
CPC .................. G01D 5/2006; G01D 5/202
(Continued)

(56) References Cited

U.S. PATENT DOCUMENTS

| 6,525,530 B1* | 2/2003 | Jansson | H04B 5/00 |
| | | | 324/207.16 |
| 7,126,495 B2* | 10/2006 | Netzer | G01D 5/2415 |
| | | | 324/658 |
| 7,791,506 B2* | 9/2010 | Riihimaki | G06F 3/0202 |
| | | | 200/19.36 |

FOREIGN PATENT DOCUMENTS

| DE | 19903750 C2 | 7/2003 |
| DE | 102004006901 C5 | 8/2005 |

(Continued)

OTHER PUBLICATIONS

International Search Report dated Oct. 21, 2014 in International Application No. PCT/EP2014/066685, 2 pages.
(Continued)

*Primary Examiner* — Reena Aurora
(74) *Attorney, Agent, or Firm* — Brinks Gilson & Lione

(57) ABSTRACT

A sine wave oscillator for an inductive sensor system is disclosed. The sine wave oscillator comprises a decoupler and a low-pass filter, wherein the decoupler is configured to provide a pulse width modulated signal as a decoupled signal at one output of the decoupler. One input of the low-pass filter is connected to the output of the decoupler. The low-pass filter is configured to provide a sinusoidal signal for the inductive sensor system by using the inverted signal at an output of the low-pass filter. The sine wave oscillator further comprises a microcontroller that is designed to provide the pulse width modulated signal with a predetermined frequency and a predetermined duty cycle at one pin of the microcontroller.

20 Claims, 3 Drawing Sheets

Figure 1:
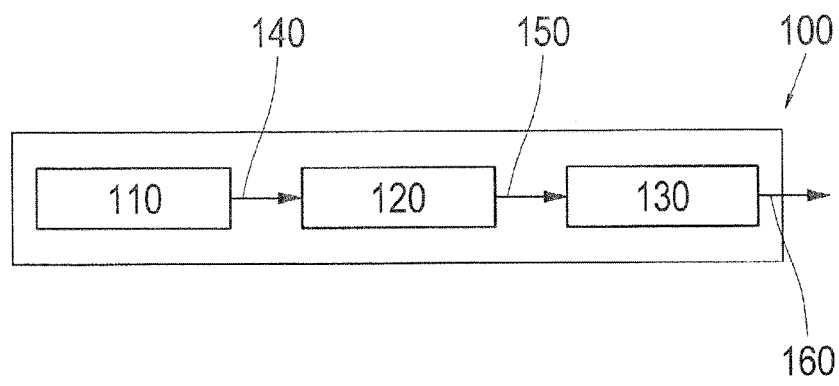

(51) Int. Cl.
*G01D 5/20* (2006.01)
*H03K 4/92* (2006.01)
(58) Field of Classification Search
USPC .................................................... 324/207.16
See application file for complete search history.

(56) References Cited

FOREIGN PATENT DOCUMENTS

| | | |
|---|---|---|
| DE | 102007015008 A1 | 10/2008 |
| DE | 102008063936 A1 | 6/2010 |
| DE | 102012005685 A1 | 9/2013 |
| EP | 1672323 A2 | 6/2006 |

OTHER PUBLICATIONS

International Search Report and Written Opinion dated Oct. 21, 2014 in International Application No. PCT/EP2014/066685, 10 pages, German Language.
Search Report dated Feb. 3, 2014 in German Application No. DE 10 2013 218 294.5, 7 pages, German Language, including English Translation of p. 8.

* cited by examiner

SINE WAVE OSCILLATOR AND INDUCTIVE SENSORS

This application is a filing under 35 U.S.C. § 371 of International Patent Application PCT/EP2014/066685, filed Aug. 4, 2014, and claims the priority of DE 10 2013 218 294.5, filed Sep. 12, 2013. These applications are incorporated by reference herein in their entirety.

The present disclosure relates to a sine wave oscillator for an inductive sensor system, an inductive sensor system with a sine wave oscillator, a method for producing a sine wave oscillator as well as a corresponding method for operating an inductive sensor system.

In an inductive sensor system, a physical quantity is used for the controlling of the inductances. For example, the inductance of a coil is dependent on the square of the number of the windings and the magnetic resistance of the circuit. The inductance of the coil can hereby be influenced from the outside by means of a corresponding damping element. Such a principle of operation is used e.g. for determining the position, wherein a damping element is moved over a plurality of coils. The sensor system is hereby excited by a regulated sinusoidal signal which is provided by means of an analog oscillator or resonator.

The EP 1 672 323 A2 discloses a sensor unit with staggered actuation surfaces.

In view of the above, the present disclosure provides an improved sine wave oscillator for an inductive sensor system, an improved inductive sensor system with a sine wave oscillator, a method for producing a sine wave oscillator as well as a corresponding method for operating an inductive sensor system according to the independent claims. Preferred embodiments are derived from the dependent claims and from the following description.

A microcontroller may feature an internal phase lock loop (internal PLL), and can output a pulse width modulated signal with a frequency in the megahertz range by using the phase lock loop at one pin of the microcontroller. The microcontroller can perform other tasks simultaneously, in particular in parallel. Thus, an additional or alternatively existing microcontroller can be used as a clock generator for an inductive sensor system. By means of a decoupler, which is e.g. made in form of an inverter or buffer, the pulse width modulated signal that was provided at the pin of the microcontroller can be decoupled. The pulse width modulated signal, which may approximately be a square wave signal, can be converted into a regulated sinusoidal signal by means of a downstream low-pass filter. Advantageously, the regulated sinusoidal signal can be provided for an inductive sensor system.

A sine wave oscillator for an inductive sensor system consists of a decoupler, a low-pass filter and a microcontroller, wherein the decoupler is configured to provide a pulse width modulated signal as a decoupled signal at one output of the decoupler, whereby one input of the low-pass filter is connected to the output of the decoupler, and wherein the low-pass filter is configured in such a way that it provides a sinusoidal signal for the inductive sensor system by using the inverted signal at one output of the low-pass filter, whereby the microcontroller is configured to provide the pulse width modulated signal at one pin of the microcontroller with a predetermined frequency and a predetermined duty cycle.

A sine wave oscillator can be understood to be a device that provides a sinusoidal signal. This may be a regulated sinusoidal signal. The inductive sensor system may be configured to detect a position and/or an angle. A microcontroller, briefly referred to as µC, may hereby provide the pulse width modulated signal. A pulse width modulated signal can be understood to be a square wave signal with a predetermined duty cycle. The duty cycle can be referred to by the English term "duty cycle". The duty cycle in particular, may be 50%. The predetermined frequency of the pulse width modulated signal may be a frequency within the megahertz range. The predetermined frequency can be constant. The pulse width modulated signal may have a frequency of 12 MHz. A decoupler can be understood to be a buffer or an inverter. It is possible that the decoupler is configured to electrically decouple a signal at its output from a signal at its input. The decoupler may be configured to invert a signal at its input, in particular a pulse width modulated signal. The decoupler can be designed to prevent a signal feedback to the microcontroller. The decoupled signal can be understood to be an inverted signal. The low-pass filter may be constructed from analog components. It is possible that the low-pass filter is designed to filter out high frequencies. The low-pass filter can thus convert a square wave signal which is applied to its input into a sinusoidal signal or approximately sine-shaped signal.

Further, the low-pass filter can be configured as an analogue low-pass filter of the third order. By means of a third-order low-pass filter, a pulse width modulated square wave signal can be efficiently converted into an approximately sine-shaped signal.

The low-pass filter may be constructed of at least one resistor, one inductive element, in particular a coil, and at least two capacitances. Hereby, the resistor and the coil, which can generally be understood as an inductance, can be connected in series. Between the resistor and the coil as well as between the coil and the output of the low-pass filter, a respective capacitance, which is connected to the ground on one side, can be connected to the circuit.

A resistor may be arranged between the pin of the microcontroller and the input of the decoupler.

An inductive sensor system with a plurality of coils that are arranged in series, with at least one damping element that is arranged in such a way that it can be moved over the coils as well as with a control unit that is adapted to control the coils by using a sinusoidal signal and to determine a position of the damping element in relation to the coils, consists of an embodiment of a sine wave oscillator as it was described above, in order to provide the sinusoidal signal.

The inductive sensor system may be configured to detect a position or a motion. To accomplish this, the damping element can be moved over the coils that are arranged in series. The inductive sensor system may be configured to detect the position of the damping element by a change in the inductances of the plurality of coils.

The microcontroller of the sine wave oscillator can include the control unit. A microcontroller can perform a number of tasks. In one embodiment, it is possible that the microcontroller performs a number of tasks in parallel. Advantageously, the microcontroller can be part of the control unit of the inductive sensor system. The microcontroller can provide a pulse width modulated signal with a predetermined frequency and a predetermined duty cycle for the sine wave oscillator at one pin. Thus, a sine wave oscillator may be advantageously integrated in an inductive sensor system with very little effort. Thus, the microcontroller of the sine wave oscillator can include control tasks or a device to control the coils and a device for determining a location of the damping element in relation to the coils.

The damping element can have the shape of a diamond. Hereby the longitudinal extension of the damping element may corresponds to the width of at least two coils, in particular to the width of three coils. The edges of the diamond shape of the damping element can be curved inwards in a concave way. The diamond shape of the damping element makes a particularly exact determination of the position of the damping element in relation to the coils possible.

The damping element can be moved over the coils in a straight path and alternatively or additionally in an arc-shaped path. When the damping element is moved over the coils in a straight path, the coils are advantageous arranged in a straight line. If the movement of the damping element over the coils is in an arc-shaped way, the coils are advantageously arranged in a corresponding circular arc. When the movement of the damping element over the coils is done in an arc-shaped manner, the inductive sensor system can be used for an angle determination.

The microcontroller of the sine wave oscillator can be configured to provide at least one digital signal for a controlling along with a simultaneous or alternative evaluation of the coils. The microcontroller of the sine wave oscillator may consist of an analog-digital converter which is designed to digitize a converted of alternatively or additionally rectified current or voltage of the sine wave oscillator. It is possible that the microcontroller of the sine wave oscillator includes the control unit. A microcontroller can perform a number of tasks. In one embodiment, it is possible that a microcontroller performs a number of tasks in parallel. A microcontroller that is part of the control unit of an inductive sensor system can advantageously provide a pulse width modulated signal with a predetermined frequency and a predetermined duty cycle for the sine wave oscillator at one pin. Thus, a sine wave oscillator can be advantageously integrated in an inductive sensor system with very little effort.

A method for producing a sine wave oscillator according to one of the before-mentioned embodiments includes the following steps:

providing a microcontroller, a decoupler and a low-pass filter;

arranging the microcontroller, the decoupler and the low-pass filter to function as a sine wave oscillator.

A method for producing an inductive sensor system according to one of the before-mentioned embodiments includes the following steps:

providing a plurality of coils and/or at least one damping element and/or a control unit and/or a microcontroller and/or a decoupler and/or a low-pass filter;

arranging the plurality of coils and/or the at least one damping element and/or the control unit and/or the microcontroller and/or the decoupler and/or the low-pass filter to function as an inductive sensor system.

A method for operating an inductive sensor system according to one of the before-mentioned embodiments includes the following steps:

providing a pulse width modulated signal with a predetermined frequency and a predetermined duty cycle at one pin of the microcontroller of the sine wave oscillator according to one of the above-mentioned embodiments;

processing the pulse width modulated signal to a regulated sinusoidal signal as a HF current;

determining the damping of the plurality of coils of the inductive sensor system by using the regulated sinusoidal signal; and evaluating the damping of the plurality of coils in order to determine a position of the damping element.

A control unit may be an electrical device which processes sensor signals and which sends out control signals accordingly. The control unit may comprise one or more suitable interfaces, which can be designed as hardware and/or software. If the interfaces are designed as hardware, they can e.g. be part of an integrated circuit, in which functions of the control unit are processed. The interfaces can also be individual integrated circuits or at least partially consist of discrete components. If the interfaces are designed as software, they can be software modules which are e.g. on hand on a microcontroller along with other software modules.

A computer program product with program code is also advantageous, which can be stored on a machine-readable carrier such as a semiconductor memory a hard drive or an optical memory, and which can be used to perform the method according to one of the above-mentioned embodiments when the program is run on a computer, a microcontroller or a control unit.

Figure 2:
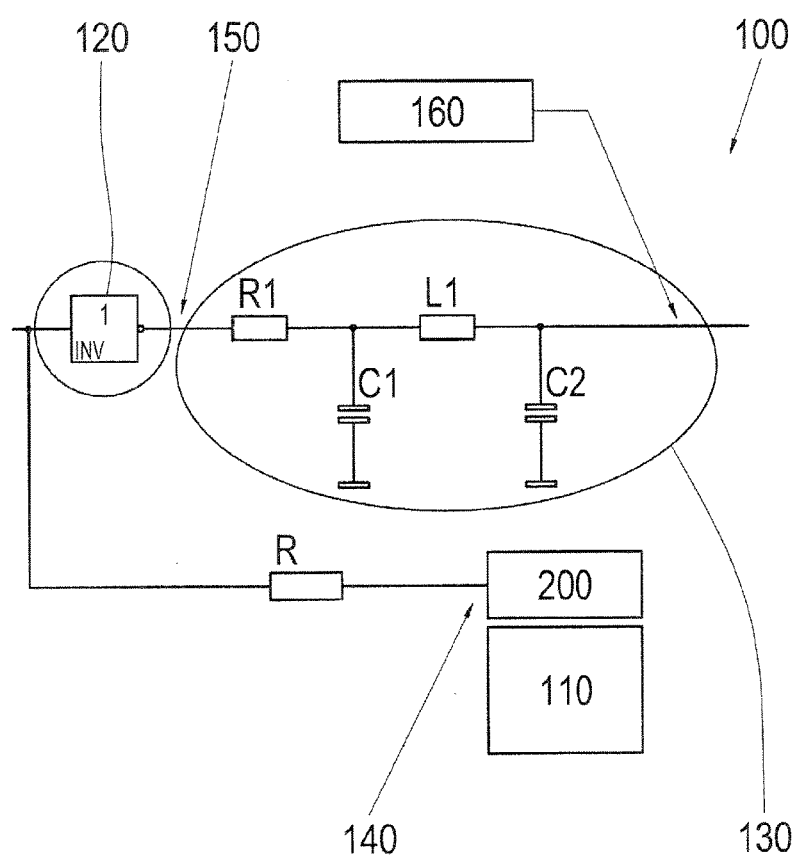
Figure 3:
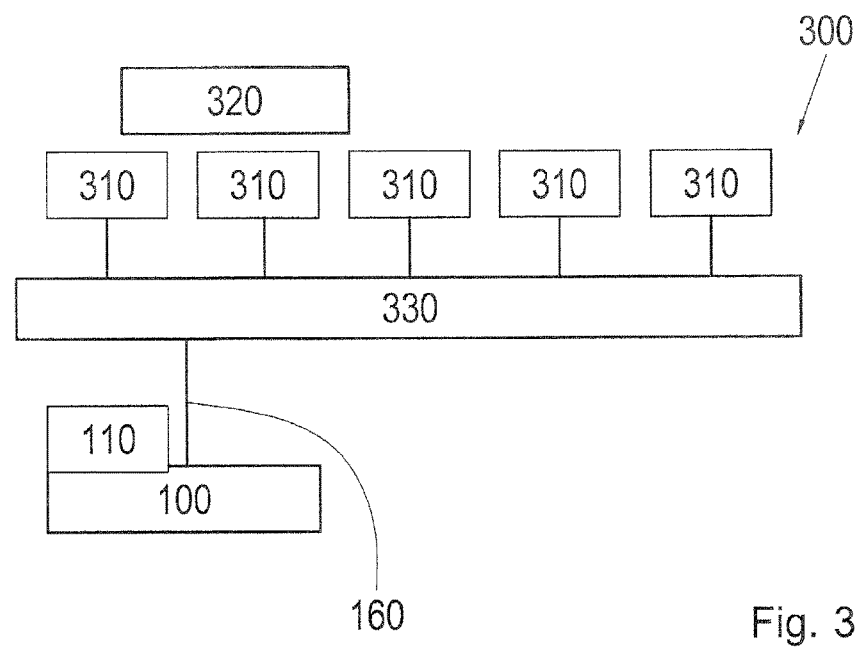
Figure 4:
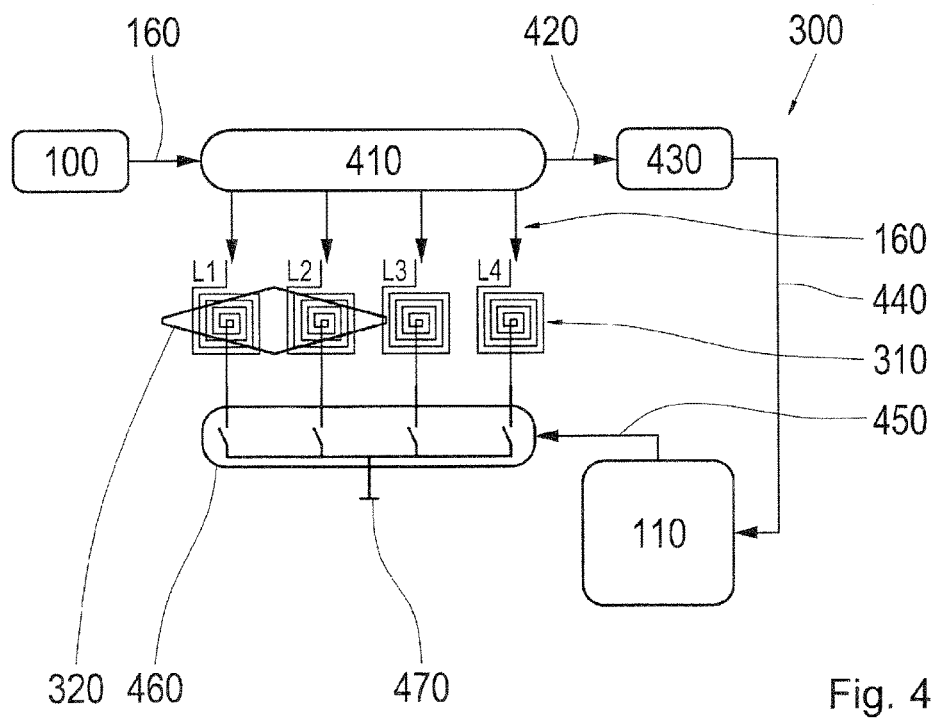
Figure 5:
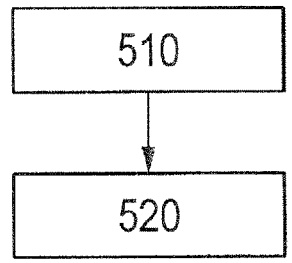
Figure 6:
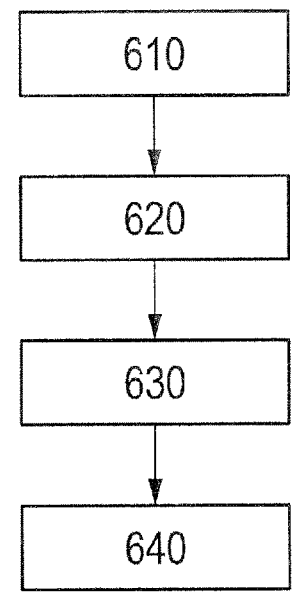

The disclosure will be explained in more detail by way of the exemplified drawings that are attached. It is depicted:

FIG. 1 a block diagram of a sine wave oscillator in accordance with one embodiment of the present disclosure;

FIG. 2 an equivalent circuit diagram of a sine wave oscillator in accordance with one embodiment of the present disclosure;

FIG. 3 a schematic depiction of an inductive sensor system in accordance with one embodiment of the present disclosure;

FIG. 4 a schematic depiction of an inductive sensor system in accordance with one embodiment of the present disclosure;

FIG. 5 a flow chart of a method for producing a sine wave oscillator in accordance with one embodiment of the present disclosure; and FIG. 6 a flow chart of a method for operating an inductive sensor system in accordance with one embodiment of the present disclosure.

In the following description of preferred embodiments of the present disclosure, the same or similar reference signs are used for similarly functioning components that are depicted in the different figures, whereby a repeated description of these components is omitted.

FIG. 1 depicts a block diagram of a sine wave oscillator 100 in accordance with one embodiment of the present disclosure. The sine wave oscillator 100 is designed to provide a regulated sinusoidal signal for an inductive sensor system. The sine wave oscillator 100 comprises a microcontroller 110, a decoupler 120, as well as a low-pass filter 130. The microcontroller is designed to provide a pulse width modulated signal 140 with a predetermined frequency and a predetermined duty cycle at one pin of the microcontroller. The decoupler 120 is designed as an inverter. A signal 140 at one input of the decoupler 120 will be provided as inverted signal 150 at an output of the decoupler 120. The input of the decoupler 120 is connected to the pin of the microcontroller 110. The output of decoupler 120 is connected to the low-pass filter 130. A sinusoidal signal 160 for an inductive sensor system is provided at an output of low-pass filter 130.

In one embodiment, low-pass filter 130 is configured as an analogue low-pass filter of the third order.

In one embodiment, decoupler 120 is designed as a buffer, in particular as an inverter.

One aspect of the present disclosure is a simplification of an electronic circuit. In comparison to the prior art, components can be reduced, which leads to a significant cost reduction.

FIG. 2 depicts an equivalent circuit diagram of a sine wave oscillator in accordance with one embodiment of the present disclosure. The sine wave oscillator 100 can be an embodiment of the sine wave oscillator 100 which was depicted in FIG. 1. In the depicted embodiment, low-pass filter 130 is made up of at least one resistor R1, one inductive element L1, in particular a coil L1, as well as at least two capacitances C1, C2. The input of low-pass filter 130 is connected to resistor R1. Resistor R1 is connected to inductive element L1. Inductive element L1 is connected to the output of the low-pass filter. Capacitance C1 is connected to the ground and to the connection between resistor R1 and inductive element L1. Capacitance C2 is connected to the ground and to the connection between inductive element L1 and the output of the low-pass filter 130.

In the embodiment, a resistor R is arranged between pin 200 of microcontroller 110 and the input of decoupler 120. Decoupler 120 is designed as an inverter.

In comparison to existing concepts for a sine wave oscillator 100, one embodiment of the present disclosure can function without a gate oscillator with inverter for generating a square wave signal 140 (oscillator resonator) with a high and stable amplitude. Decoupler 120 serves as an additional inverter for decoupling. Low-pass filter 130 filters out the sine waves 160 (carrier) and suppresses harmonics. Thus, a high amplitude stability can be achieved, since variations of the resonator are not carried over into the signal of the measuring coil. An amplitude-stable signal is provided at the output of the gate oscillator (5V square wave signal). The coupled-out sinusoidal signal is independent of the amplitude on the resonator, since decoupler 120 relieves the square wave generator.

Due to the ever increasing speeds of microcontrollers (μC) 110 and clock generators by means of an internal PLL or phase control loop, it is no problem to output frequencies in the megahertz range in form of a pulse width modulated signal 140 or PWM at the port pins. Since each inductive sensor system uses a microcontroller 110 for the evaluation of the signals, an embodiment uses the clock of the microcontroller 110. The pulse width modulated signal (PWM) 140 that was produced by the microcontroller 110 is supplied before the decoupler 120 for decoupling. As a result, costs are reduced significantly.

FIG. 3 shows a schematic depiction of an inductive sensor system 300 in accordance with one embodiment of the present disclosure. The inductive sensor system 300 features a sine wave oscillator 100. The sine wave oscillator 100 can be an embodiment of one of the sine wave oscillators 100 that was depicted in FIG. 1 and FIG. 2. The inductive sensor system 100 comprises a plurality of coils 310 that are arranged in series, at least one damping element 320, which is arranged in such a way that it can be moved over the coils 310, a control unit 330, which is adapted to control the coils 310 and to determine a position of the damping element 320 in relation to the coils 310 as well as the sine wave oscillator 100.

Depending on the embodiment, the coils 310 are arranged along a straight line or along a circular arc-shape. The damping element 320 can be moved over the coils 310 along a trajectory which is determined by the coil centers, whereby the inductive sensor system 300 is adapted to determine the position of the damping element 320 in relation to the coils 310.

In one embodiment, damping element 320 has a diamond shape.

In one embodiment, the coils 310 are arranged along a straight line. Damping element 320 can be moved over the coils 310 in a straight path. In another embodiment, the coils 310 are arranged along a circular arc and damping element 320 can be moved over the coils 310 in an arc-shaped path.

In one embodiment, a microcontroller 110 assumes tasks to control the inductive sensor system 300 such as providing the pulse width modulated signal of the sine wave oscillator 100. Thus, in one embodiment, microcontroller 110 of the sine wave oscillator provides at least one digital signal for a controlling or evaluating of the coils. In one embodiment, microcontroller 110 of the sine wave oscillator consists of an analog-digital converter which digitizes a converted or rectified current or voltage of the sine wave oscillator 100. In an undisclosed embodiment, control unit 330 includes the microcontroller 110 of the sine wave oscillator 100. In this case, control unit 330 provides the pulse width modulated signal for the sine wave oscillator 100.

FIG. 4 shows a schematic depiction of an inductive sensor system in accordance with one embodiment of the present disclosure. The inductive sensor system can be an embodiment of the inductive sensor system that was depicted in FIG. 3. Four coils 310, which are individually marked with the reference signs L1, L2, L3, L4, are arranged along a straight line. A diamond-shaped damping element 320 extends over the coils L1 and L2. Damping element 320 is designed in such a way that it can be moved over the coils 320 which are arranged in a straight line. A regulated sine wave oscillator 100 provides a sinusoidal signal 160. In the embodiment for example, sinusoidal signal 160 has a frequency of 12 MHz and can also be described as an HF current. Sinusoidal signal 160 is supplied to an amplifier and current-voltage converter 410, which directs the HF current or the sinusoidal signal 160 to the coils 310. At an output of the amplifier and the current-voltage converter 410, an HF output voltage 420 is produced and supplied to an HF rectifier 430. The HF rectifier 430 outputs the converted HF voltage 420 as a DC signal 440 with a level in the range from 0 to 5 V, which will be supplied to an analog-digital converter input of microcontroller 110.

At one digital output of microcontroller 110, a corresponding digital signal 450 is supplied to a multiplexer 460 which is connected to the coils 310. The switchboards of multiplexer 460 are connected to ground 470. If a switching point of multiplexer 460 is closed, the corresponding coil 310 is connected to ground. The switchboard can also be arranged between current-voltage converter 410 and the coils 310.

In an undisclosed embodiment, microcontroller 110 is connected to sine wave oscillator 100 and thus a functional part of sine wave oscillator 100 as well. Microcontroller 110 can thus provide a pulse width modulated signal with a predetermined frequency and a predetermined duty cycle at one pin.

FIG. 5 depicts a flow chart of a method 500 for producing a sine wave oscillator in accordance with one embodiment of the present disclosure. The sine wave oscillator can be an embodiment of the sine wave oscillator that was described in FIG. 1 or in FIG. 2. Method 500 comprises a step 510 for providing a microcontroller, a decoupler and a low-pass filter as well as a step 520 for arranging the microcontroller, the decoupler and the low-pass filter to an inductive sensor system.

FIG. 6 depicts a flow chart of a method 600 for operating an inductive sensor system in accordance with one embodiment of the present disclosure. The inductive sensor system can be an embodiment of the inductive sensor system that was depicted in FIG. 3 or FIG. 4. Method 600 comprises a step 610 for providing a pulse width modulated signal with a predetermined frequency and a predetermined duty cycle at a pin of a microcontroller of a sine wave oscillator, a step 620 for processing the pulse width modulated signal to a regulated sinusoidal signal as an HF current, a step 630 for determining the damping of the plurality of coils of the inductive sensor systems by using the regulated sinusoidal signal, as well as a step 640 for evaluating the damping of the plurality of coils in order to determine a position of the damping element.

The embodiments described and shown in the figures are chosen only by way of example. Different embodiments may be combined in whole or in terms of individual features. It is also possible that an embodiment may be supplemented by features of another embodiment.

Individual steps of the methods according to the disclosure may be repeated or also performed in a different sequence than in the described order.

If an embodiment includes an "and/or" link between a first characteristic and a second characteristic, this can be understood in a way that the embodiment according to one version features both the first characteristic as well as the second characteristic and according to a further version, either only the first characteristic or only the second characteristic.

REFERENCE SIGN

100 Sine wave oscillator
110 Microcontroller
120 Decoupler
130 Low-pass filter
140 Pulse width modulated signal
150 Inverted signal
160 Sinusoidal signal
R, R1 Resistor
L1 Inductive element, coil
C1, C2 Capacitance
300 Inductive sensor system
310 Coil
320 Damping element
330 Control unit
410 Amplifier and current-voltage converter
420 HF voltage
430 HF rectifier
440 DC voltage
450 Digital signal
460 Multiplexer
470 Ground
500 A method for producing
510 Step for providing
520 Step for arranging
600 Method for operating
610 Step for providing
620 Step for processing
630 Step for determining
640 Step for evaluating

The invention claimed is:

1. A sine wave oscillator for an inductive sensor system, the sine wave oscillator comprising:
   a decoupler and
   a low-pass filter,
   wherein the decoupler is configured to provide a pulse width modulated signal as a decoupled signal at one output of the decoupler,
   wherein one input of the low-pass filter is connected to the output of the decoupler, and
   wherein the low-pass filter is configured to provide a sinusoidal signal for the inductive sensor system by using the decoupled signal at one output of the low-pass filter,
   wherein a microcontroller is designed to provide the pulse width modulated signal with a predetermined frequency and a predetermined duty cycle at one pin of the microcontroller.

2. The sine wave oscillator according to claim 1, wherein the low-pass filter is configured as an analog low-pass filter of the third order.

3. The sine wave oscillator according to claim 2, wherein the low-pass filter comprises at least one resistor, one inductive element, and at least two capacitances.

4. The sine wave oscillator according to claim 3, wherein the inductive element is a coil.

5. The sine wave oscillator according to claim 1, wherein a resistor is arranged between the pin of the microcontroller and the input of the decoupler.

6. The sine wave oscillator according to claim 1, wherein the decoupler is a buffer.

7. The sine wave oscillator according to claim 1, wherein the decoupler is an inverter.

8. The sine wave oscillator according to claim 1, wherein an input of the decoupler is connected to the pin of the microcontroller.

9. The sine wave oscillator according to claim 1, wherein the sine wave oscillator does not include a gate oscillator.

10. An inductive sensor system comprising:
    a plurality of coils that are arranged in series,
    at least one damping element which is moveable over the coils,
    a control unit, which is adapted to control the coils by using a sinusoidal signal and to determine a position of the damping element in relation to the coils, and
    a sine wave oscillator configured to provide the sinusoidal signal, the sine wave oscillator comprising:
      a decoupler and
      a low-pass filter,
      wherein the decoupler is configured to provide a pulse width modulated signal as a decoupled signal at one output of the decoupler,
      wherein one input of the low-pass filter is connected to the output of the decoupler, and
      wherein the low-pass filter is configured to provide a sinusoidal signal for the inductive sensor system by using the decoupled signal at one output of the low-pass filter,
      wherein a microcontroller is designed to provide the pulse width modulated signal with a predetermined frequency and a predetermined duty cycle at one pin of the microcontroller.

11. The inductive sensor system according to claim 10, wherein the microcontroller of the sine wave oscillator comprises the control unit.

12. The inductive sensor system according to claim 10, wherein the damping element can be moved over the coils in a straight way.

13. The inductive sensor system according to claim 10, wherein the microcontroller of the sine wave oscillator is configured to provide at least one digital signal for controlling the coils.

14. The inductive sensor system according to claim 10, wherein the microcontroller of the sine wave oscillator comprises an analog-digital converter, which is designed to digitize a converted current of the sine wave oscillator.

15. The inductive sensor system according to claim 10, wherein the microcontroller of the sine wave oscillator comprises an analog-digital converter, which is designed to digitize a rectified current of the sine wave oscillator.

16. The inductive sensor system according to claim 10, wherein the microcontroller of the sine wave oscillator comprises an analog-digital converter, which is designed to digitize a converted voltage of the sine wave oscillator.

17. The inductive sensor system according to claim 10, wherein the microcontroller of the sine wave oscillator comprises an analog-digital converter, which is designed to digitize a rectified voltage of the sine wave oscillator.

18. The inductive sensor system according to claim 10, wherein the damping element can be moved over the coils in an arc-shaped way.

19. A method for producing a sine wave oscillator, the method comprises the following steps:
provided of a microcontroller, a decoupler and a low-pass filter; and
arranging the microcontroller, the decoupler and the low-pass filter as a sine wave oscillator wherein the decoupler is configured to provide a pulse width modulated signal as a decoupled signal at one output of the decoupler, wherein one input of the low-pass filter is connected to the output of the decoupler, wherein the low-pass filter is configured to provide a sinusoidal signal for the inductive sensor system by using the decoupled signal at one output of the low-pass filter, and wherein the microcontroller is designed to provide the pulse width modulated signal with a predetermined frequency and a predetermined duty cycle at one pin of the microcontroller.

20. A method for controlling an inductive sensor system, the inductive sensor system comprising a plurality of coils that are arranged in series, at least one damping element which is moveable over the coils, a control unit, which is adapted to control the coils by using a sinusoidal signal and to determine a position of the damping element in relation to the coils, and a sine wave oscillator configured to provide the sinusoidal signal, the sine wave oscillator comprising a decoupler and a low-pass filter, wherein the decoupler is configured to provide a pulse width modulated signal as a decoupled signal at one output of the decoupler, wherein one input of the low-pass filter is connected to the output of the decoupler, and wherein the low-pass filter is configured to provide a sinusoidal signal for the inductive sensor system by using the decoupled signal at one output of the low-pass filter, wherein a microcontroller is designed to provide the pulse width modulated signal with a predetermined frequency and a predetermined duty cycle at one pin of the microcontroller, the method comprises the following steps:
providing a pulse width modulated signal with a predetermined frequency and a predetermined duty cycle at one pin of the microcontroller of the sine wave oscillator;
processing the pulse width modulated signal to a regulated sinusoidal signal as a HF current;
determining the damping of the plurality of coils of the inductive sensor system by using the regulated sinusoidal signal; and
evaluating the damping of the plurality of coils in order to determine a position of the damping element.

* * * * *